United States Patent [19]

Hikosaka

[11] Patent Number: 5,471,115
[45] Date of Patent: Nov. 28, 1995

[54] METHOD AND APPARATUS FOR MEASURING ELECTRON DENSITY OF PLASMA

[75] Inventor: Yukinobu Hikosaka, Kawasaki, Japan

[73] Assignee: Fujitsu Limited, Kawasaki, Japan

[21] Appl. No.: 305,970

[22] Filed: Sep. 15, 1994

[30] Foreign Application Priority Data

Sep. 16, 1993 [JP] Japan .................................. 5-229363
Sep. 6, 1994 [JP] Japan .................................. 6-212636

[51] Int. Cl.$^6$ .................................................. H01J 7/24
[52] U.S. Cl. ............................. 315/111.21; 315/111.81; 315/111.41; 315/111.71
[58] Field of Search .......................... 315/111.21, 111.81, 315/111.41, 111.71, 111.01

[56] References Cited

U.S. PATENT DOCUMENTS

| | | | |
|---|---|---|---|
| 5,086,255 | 2/1992 | Okamoto et al. | 315/111.21 |
| 5,274,306 | 12/1993 | Kaufman et al. | 315/111.21 |
| 5,339,039 | 8/1994 | Carlile et al. | 315/111.21 |

OTHER PUBLICATIONS

Jpn. J. Appl. Phys. vol. 32 (1993), pp. 5129–5135, Part 1, No. 11A, Nov. 1993, T. Shirakawa et al., "Plasma Oscillation Method for Measurements of Absolute Electron Density in Plasma".

Primary Examiner—Robert J. Pascal
Assistant Examiner—Reginald A. Ratliff
Attorney, Agent, or Firm—Nikaido Marmselstein Murray & Oram

[57] ABSTRACT

A method for measuring electron density $n_p$ of a plasma in a plasma reaction chamber for semiconductor fabrication processes is capable of an accurate measurement without time-drifting of measuring values and metal contamination to semiconductor wafers. The method comprises injecting electrons in the plasma to generate a plasma oscillation, getting a plasma oscillation frequency $\omega_p$ by antenna and frequency analyzer, and easily computing $n_p$ by a well-known formula using the value of $\omega_p$. A plasma generating apparatus for semiconductor fabrication processes is capable of keeping the electron density in a plasma reaction chamber constant. The apparatus comprises feed-back circuits for feeding back a deviation signal of the computed ($n_p$) from a presetting value to an RF oscillator or a gas control unit so as to control RF power or pressure of a source gas, respectively.

11 Claims, 17 Drawing Sheets

METHOD AND APPARATUS FOR MEASURING ELECTRON DENSITY OF PLASMA

FIELD OF THE INVENTION

The present invention relates to a method and an apparatus for measuring electron density of plasma, and more specifically relates to a method and an apparatus for measuring electron density of plasma without either drift of a measuring value with time or any metal contamination in a plasma reaction chamber such as for semiconductor fabrication processes.

DESCRIPTION OF THE PRIOR ART

Conventionally, Langmuir probe method is widely used for plasma diagnostics in gaseous plasma. In this method, a metal probe is inserted in a gaseous plasma and a DC bias is applied between the probe and the ground to measure a DC current in the plasma. A measured bias-current relationship characterizes the plasma, by which electron density and electronic temperature of the plasma can be calculated.

However, Langmuir probe method in a plasma reaction chamber for semiconductor fabrication processes has following drawbacks:

(1) a metal probe such as tungsten causes metal contamination of semiconductor wafers, which degrades semiconductor device characteristics.

(2) in plasma-assisted, chemical vapor deposition (CVD) of an insulating material, the insulating material grows on a surface of the probe, which inevitably drifts a measuring value with time.

(3) for a capacitive coupled plasma apparatus, a plasma potential varies with a plasma frequency, which makes probe characteristics vary.

(4) for a magnetically-enhanced microwave plasma apparatus, probe characteristics can not be obtained without considering a complex cyclotron motion of electrons.

(5) to obtain accurate electron density, saturation current of ions or electrons is generally needed. However, it is not easy to make an accurate measurement of either of them by the probe.

Very recently, measurements of electron density in a gaseous plasma by using plasma oscillation frequency have been attempted by T. Shirakawa, el al. However in this apparatus, a hot filament of a molybdenum wire is used in the gaseous plasma to excite electron waves in the plasma, and therefore, the metal atoms evaporate inevitably. That might also cause severe metal contamination to semiconductor wafers similar to the Langmuir probe method.

SUMMARY OF THE INVENTION

It is a general object of the present invention to provide an improved method and apparatus for plasma diagnostics which are able to measure electron density of a gaseous plasma without metal contamination. As is well known, electron density $n_p$ in a plasma is related to a plasma oscillation frequency $\omega_p$ by a following equation (1):

$$n_p = \omega_p^2 \epsilon_o m_e / q^2 \approx 1.24 \times 10^{-2} (\omega_p / 2\pi)^2 \qquad (1)$$

where $\epsilon_o$ is permittivity of vacuum, $m_p$, is electron mass, and q is a charge of an electron. Thus, the electron density can be immediately given by knowing the plasma oscillation frequency.

According to one aspect of the present invention, a method for measuring characteristics of a plasma in a plasma reaction chamber comprises the steps of:

injecting electrons in the plasma from an electrode by applying an alternating electromagnetic field or an alternating electromagnetic field with a bias so that plasma oscillation is generated, measuring a plasma oscillation frequency which gives a maximum amplitude in the plasma oscillation, and calculating the characteristics in the plasma by using the plasma oscillation frequency.

According to another aspect of the present invention. An apparatus for measuring characteristics of a plasma in a plasma reaction chamber comprises:

a capacitive coupled plasma generating means for generating the plasma in a plasma generation chamber, the capacitive coupled plasma generating means having a pair of coupled electrodes between which the plasma is generated, an electron injecting means for injecting electrons in the plasma so that plasma oscillation is generated, the electron injecting means having an electron emission electrode which is capable of emitting electrons by applying a high frequency electromagnetic field, an antenna for detecting an amplitude of the plasma oscillation, and a frequency measuring means for measuring a plasma oscillation frequency which gives a maximum amplitude of the plasma oscillation.

BRIEF DESCRIPTION OF DRAWINGS

The present invention will be more apparent from the following description, when taken to conjunction with the accompanying drawings, in which.

DESCRIPTION OF THE PREFERRED EMBODIMENTS

Figure 1:
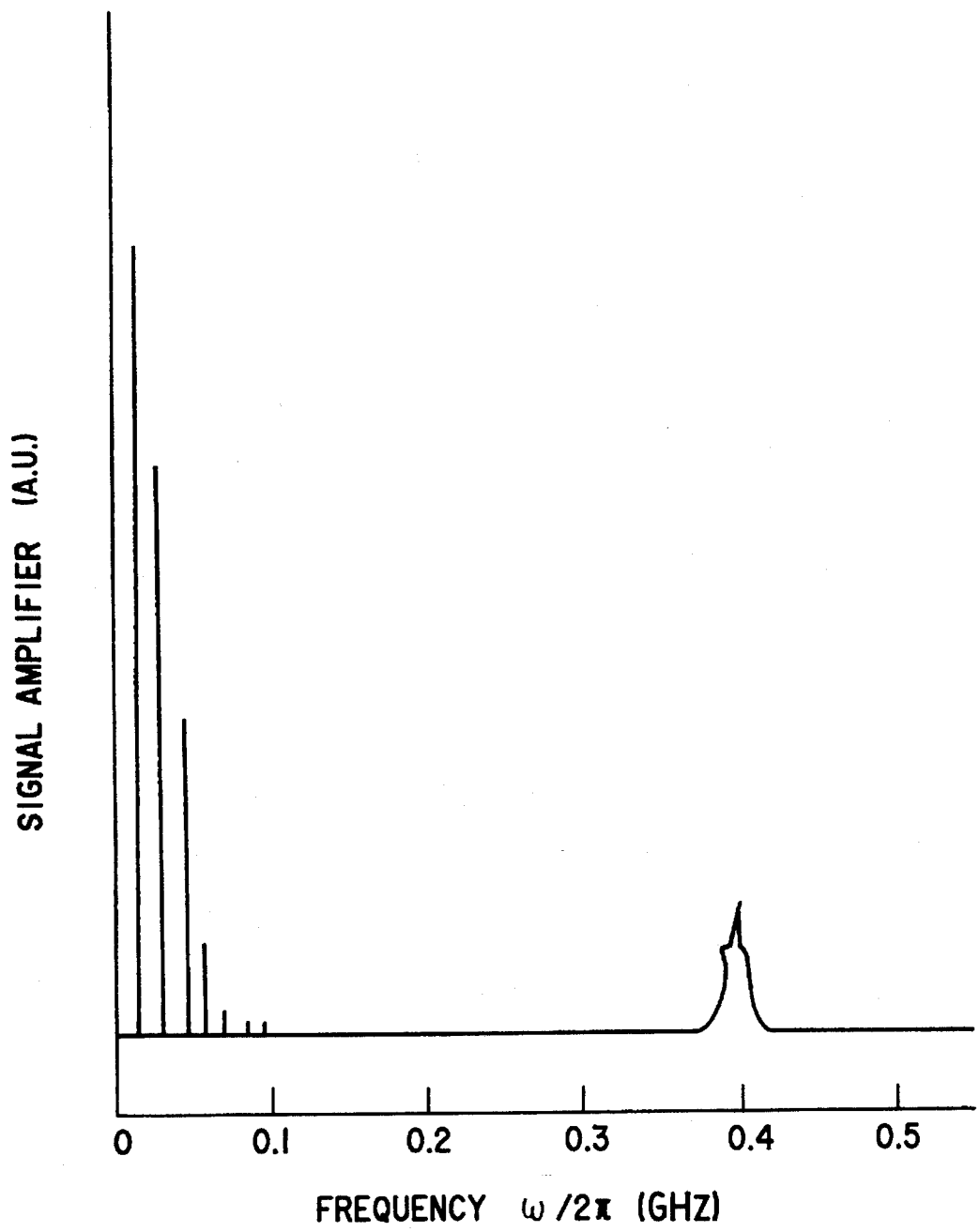
FIG. 1 shows a schematic diagram of a typical frequency spectrum (1) of a magnetoelectric field in a plasma detected by an antenna according to the present invention. A spectrum at a frequency of about 0.4 GHz indicates the plasma oscillation frequency.
Figure 3:
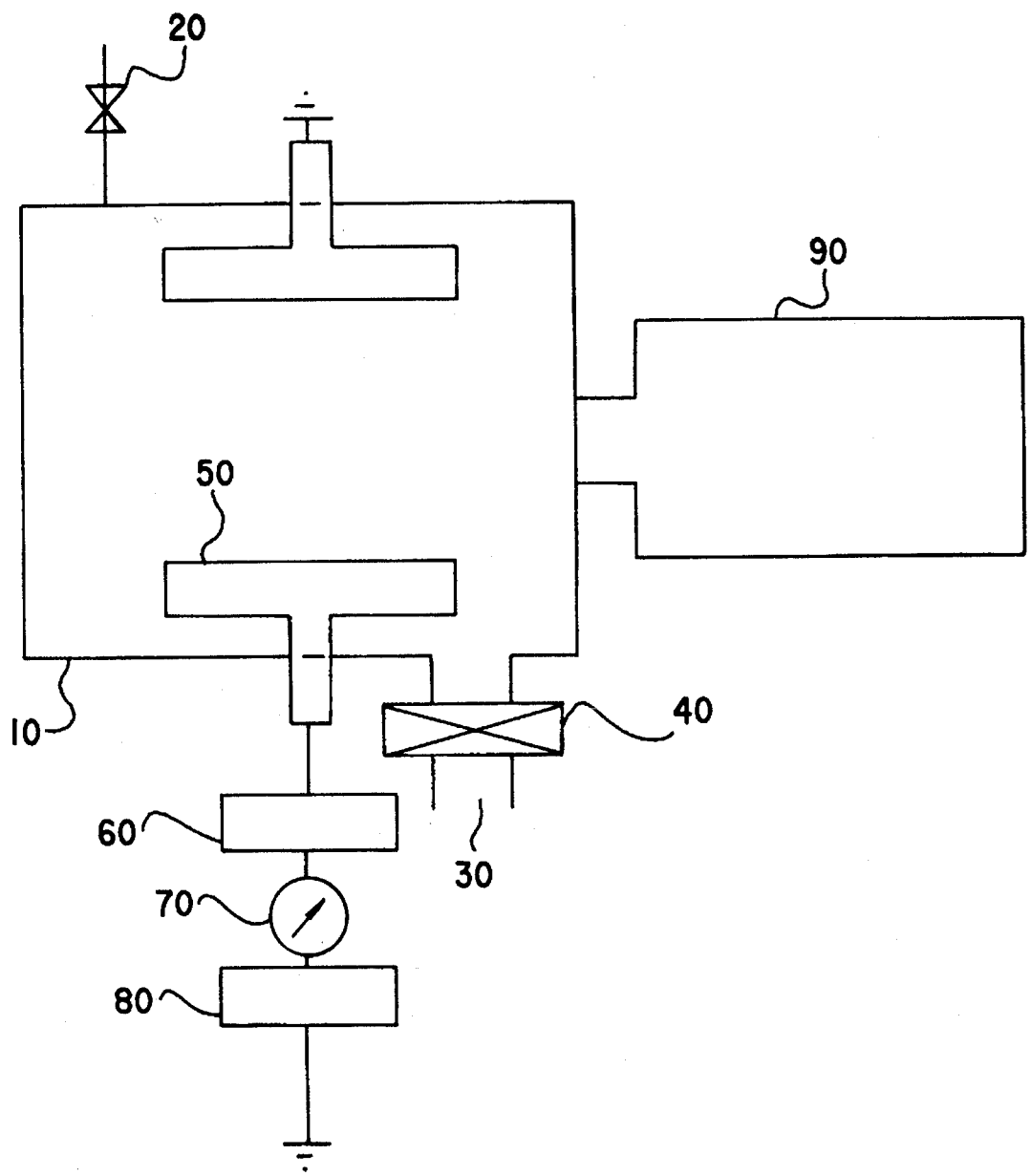
FIG. 3 shows a schematic illustration of an apparatus for the first embodiment according to the present invention.
Figure 4:
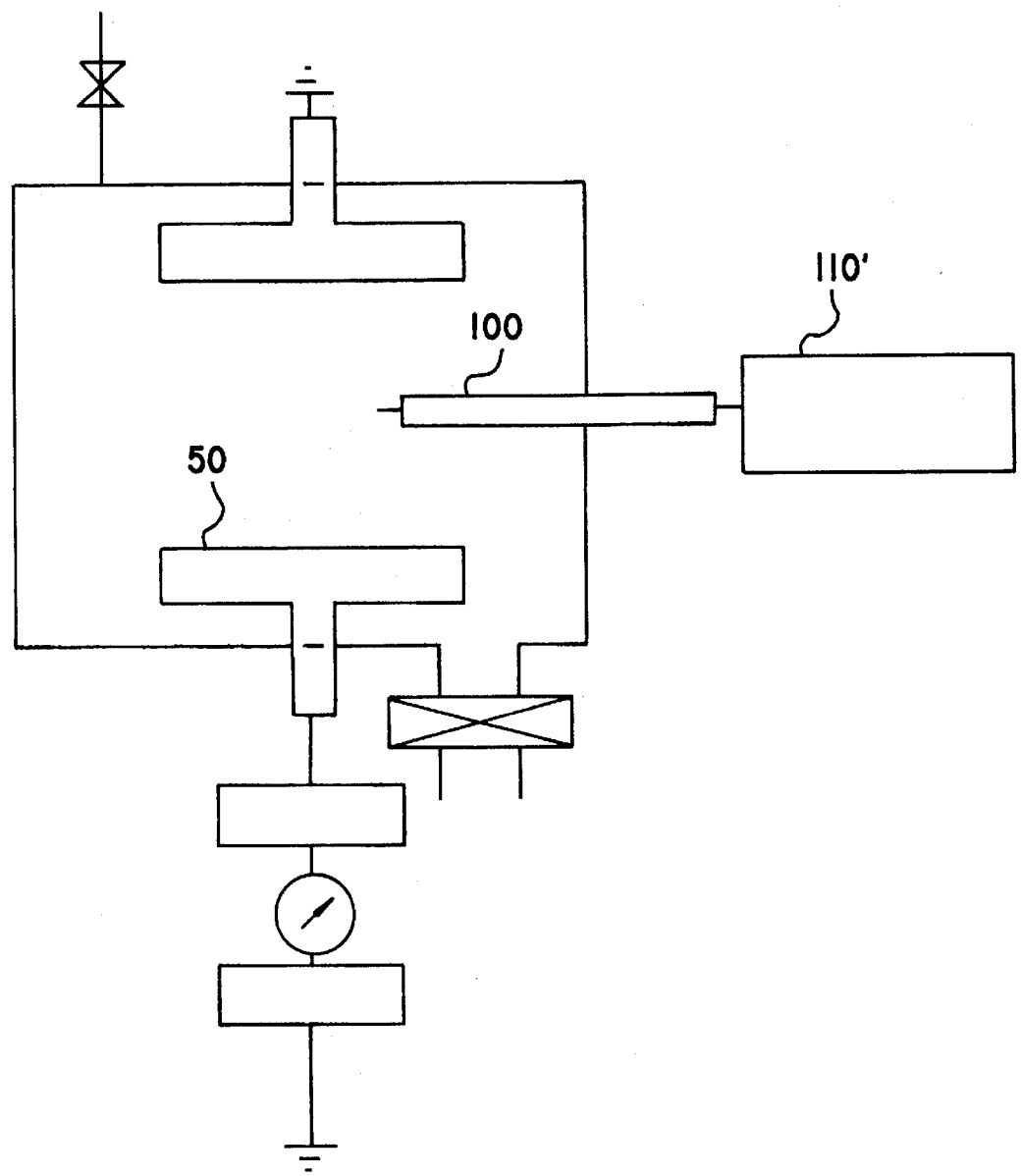
FIG. 4 also shows a schematic illustration of the apparatus with an antenna and a frequency analyzer for the first embodiment.
Figure 16:
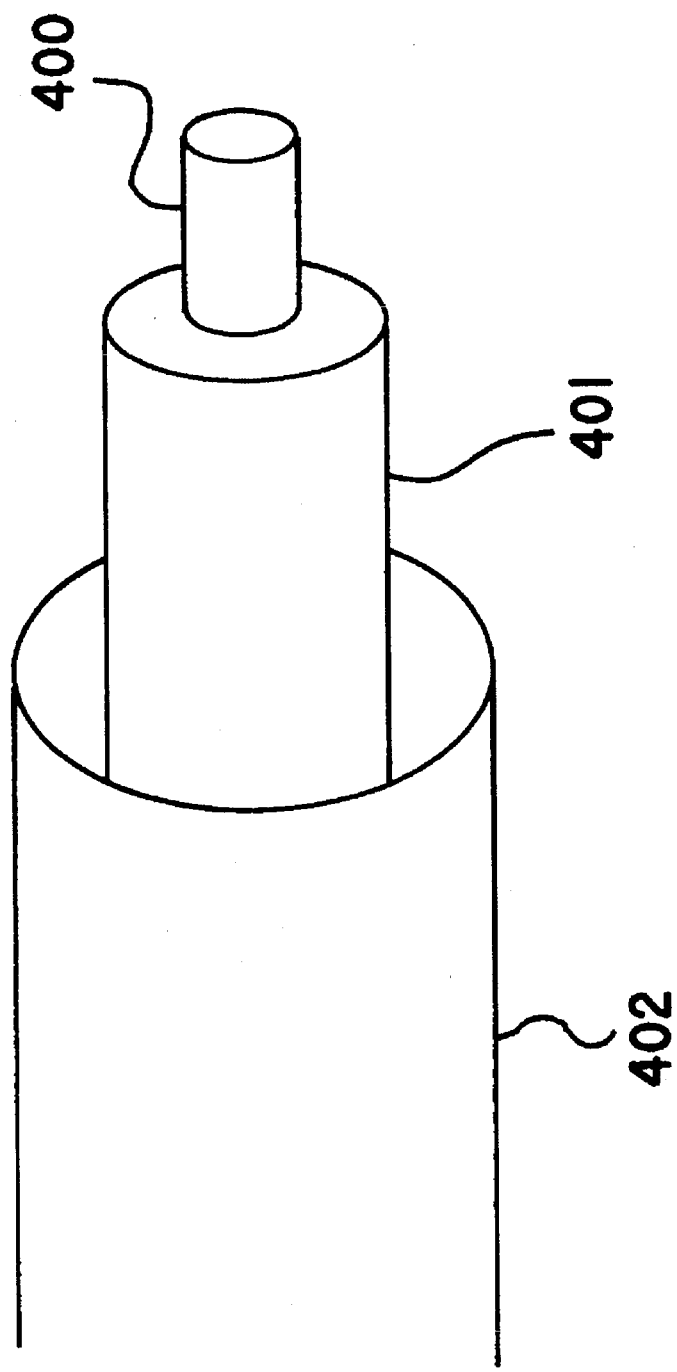
FIG. 16 shows an enlarged structure or an antenna for detecting a plasma oscillation frequency.
Figure 1:
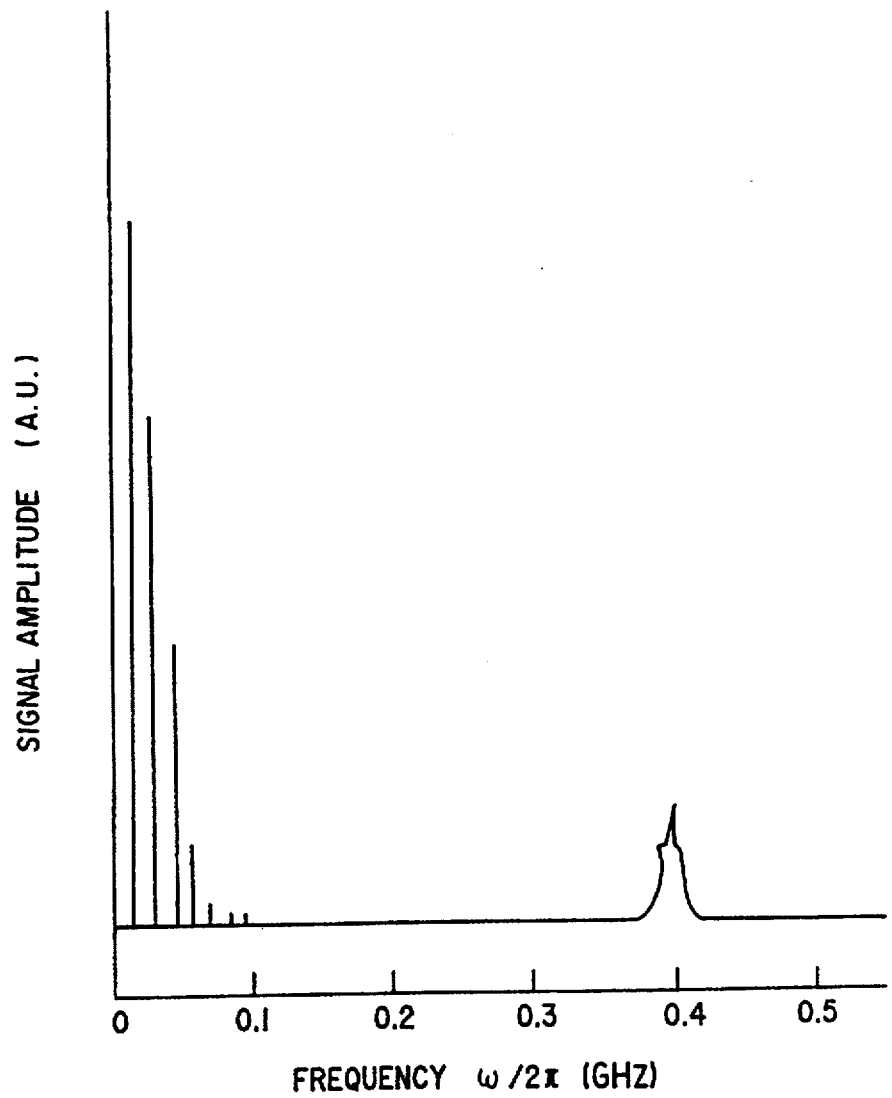
Figure 4:
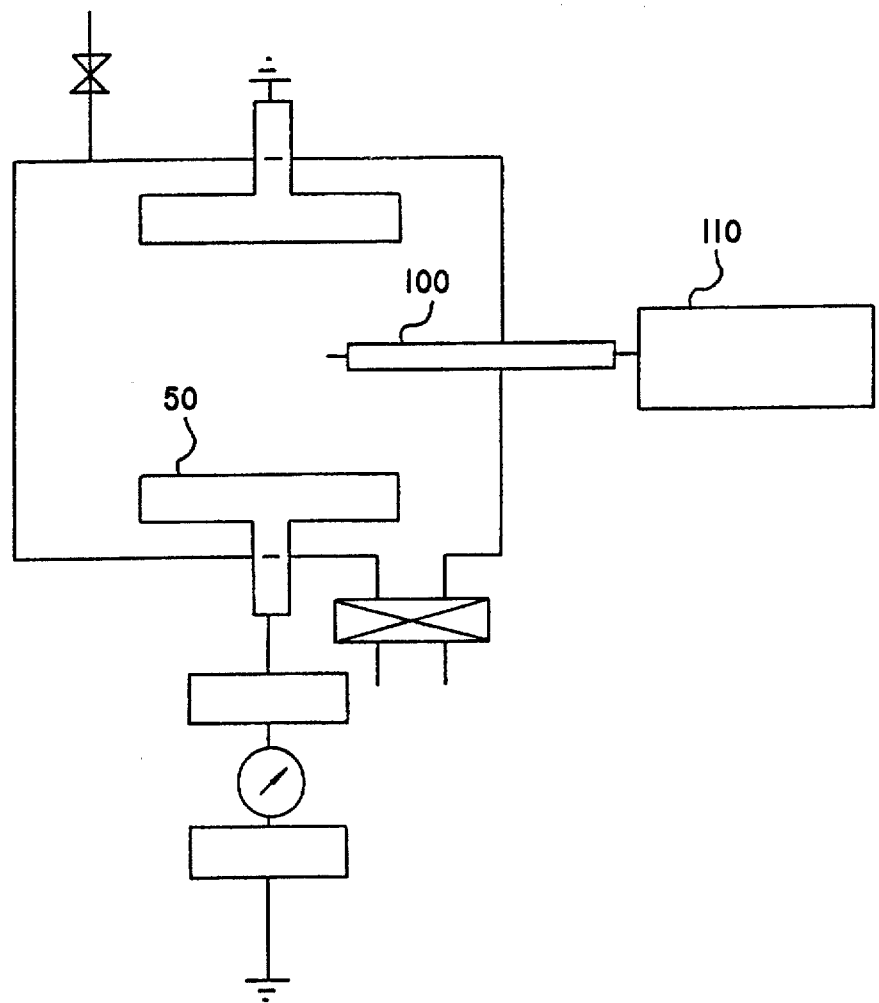

FIG. 3 shows a schematic illustration of a capacitive coupled plasma generation system for the first embodiment according to the present invention. Gases are introduced in a vacuum chamber 10 through a control unit of flow rates 20, and evacuated by an outlet 30 through a gate valve 40. Microwave power is supplied to a pair of electrodes 50 by an RF oscillator 80 followed by a power meter 70 and an impedance matching circuit 60. In the capacitive coupled plasma generation system, a plasma is generated between a pair of electrodes 50. A plasma oscillation frequency is measured by a detector 90. In practice, tetrafluoro-carbon $CF_4$ was introduced into the chamber with a flow rate of 50 SCCM, and a pressure of 100 mTorr was sustained by controling the gate vale 40. Power density was 2.0 W/cm² with a frequency of 13.56 GHz. Under these conditions, a plasma was generated in the chamber 10. In the capacitive coupled plasma generation system, as an alternating voltage of the microwave is applied to the electrode 50, a thickness of a space charge layer (called a sheath) formed in front of the electrode varies with the voltage. That injects high energy electrons into the plasma, which is called "oscillating sheath acceleration", or "wave riding". The injected electrons create an unstable condition in the plasma which generates an oscillation, of which frequency is characteristic to the density of electrons in the plasma. The frequency is usually in a microwave range which can be detected by a rod antenna. As shown in FIG. 4, a detector comprises an antenna 100 and a frequency analyzer 110. As shown in FIG. 16, the antenna is made of a copper wire 400 of 0.4 mm dia., 4 mm long, insulated by coaxial cable 401 of 50Ω, 3 mm dia., and electrically shielded by an aluminum tube 402, and that is apart from the electrode by a distance $\Delta r(=15$ mm). A signal received by the antenna is sent to the frequency analyzer. A typical frequency spectrum is shown in FIG. 1. A spectrum originated by the plasma oscillation appears in the neighborhood of 0.4 GHz. Thus, the electron density $n_p$ is given by the equation (1) as follows:

$$n_p = 2.0 \times 10^9 \, cm^-  \quad (2)$$

Figure 2:
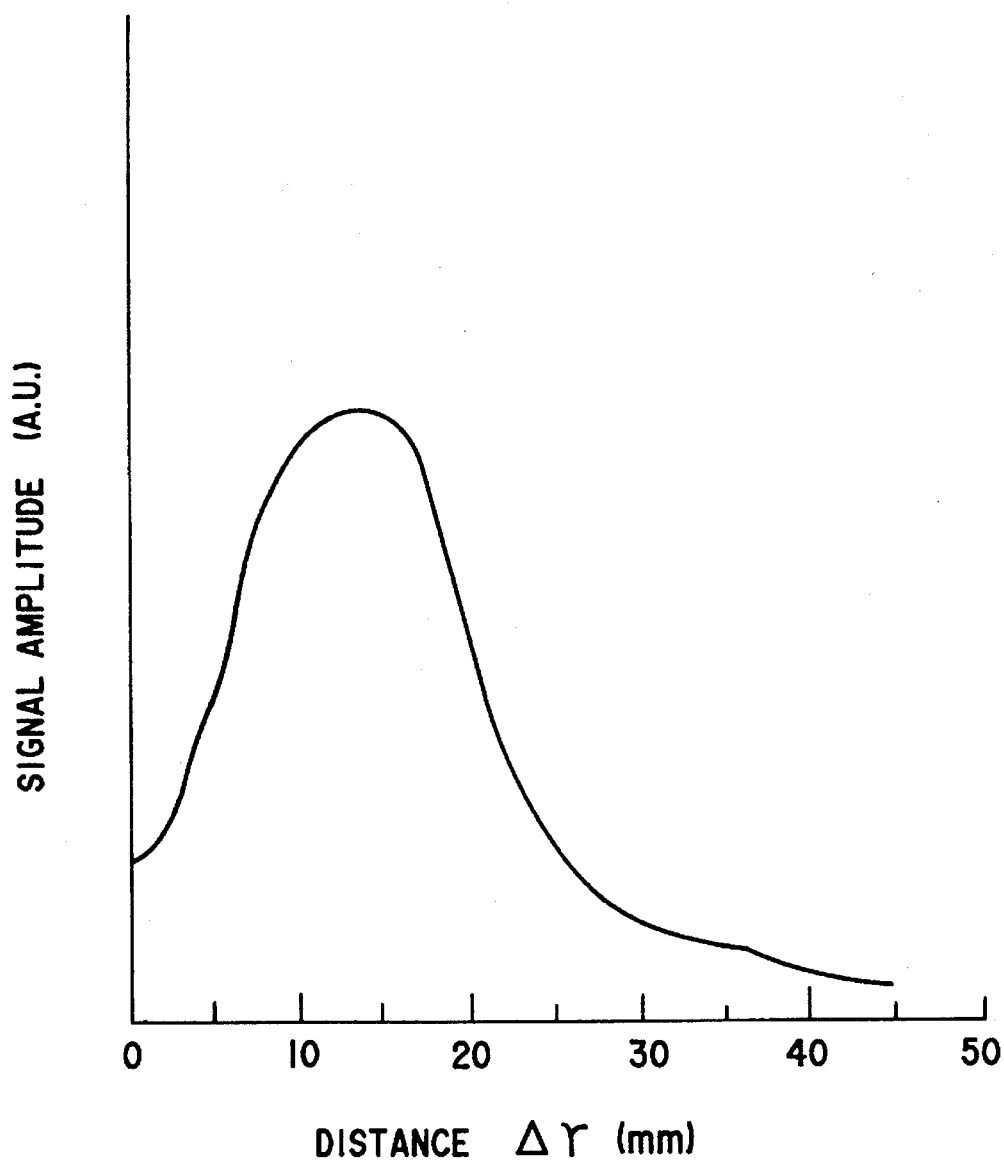
FIG. 2 shows a spatial dependence of a signal amplitude of the antenna on a distance from a wafer stage.

A group of spectra appearing at frequencies lower than 0.1 GHz are harmonic frequencies of 13.56 MHz which is an original frequency of the RF power. FIG. 2 shows a spatial dependence of the signal amplitude. An ordinate indicates the signal amplitude in arbitrary unit plotted with respect to a distance $\Delta r$ between an antenna and an RF electrode. The frequency is kept a constant value of $\omega/2_\pi=0.4$ GHz. The figure shows that the maximum amplitude of a plasma frequency was observed at a distance $\Delta r=15$ mm. It can be also said that the antenna should be located at a distance between 7.5 mm and 17.5 mm ( namely 7.5 mm<$\Delta r$<17.5 mm) from the wafer for a plasma reaction treatment to get more than an 80% of the maximum amplitude of a plasma oscillation.

Figure 5:
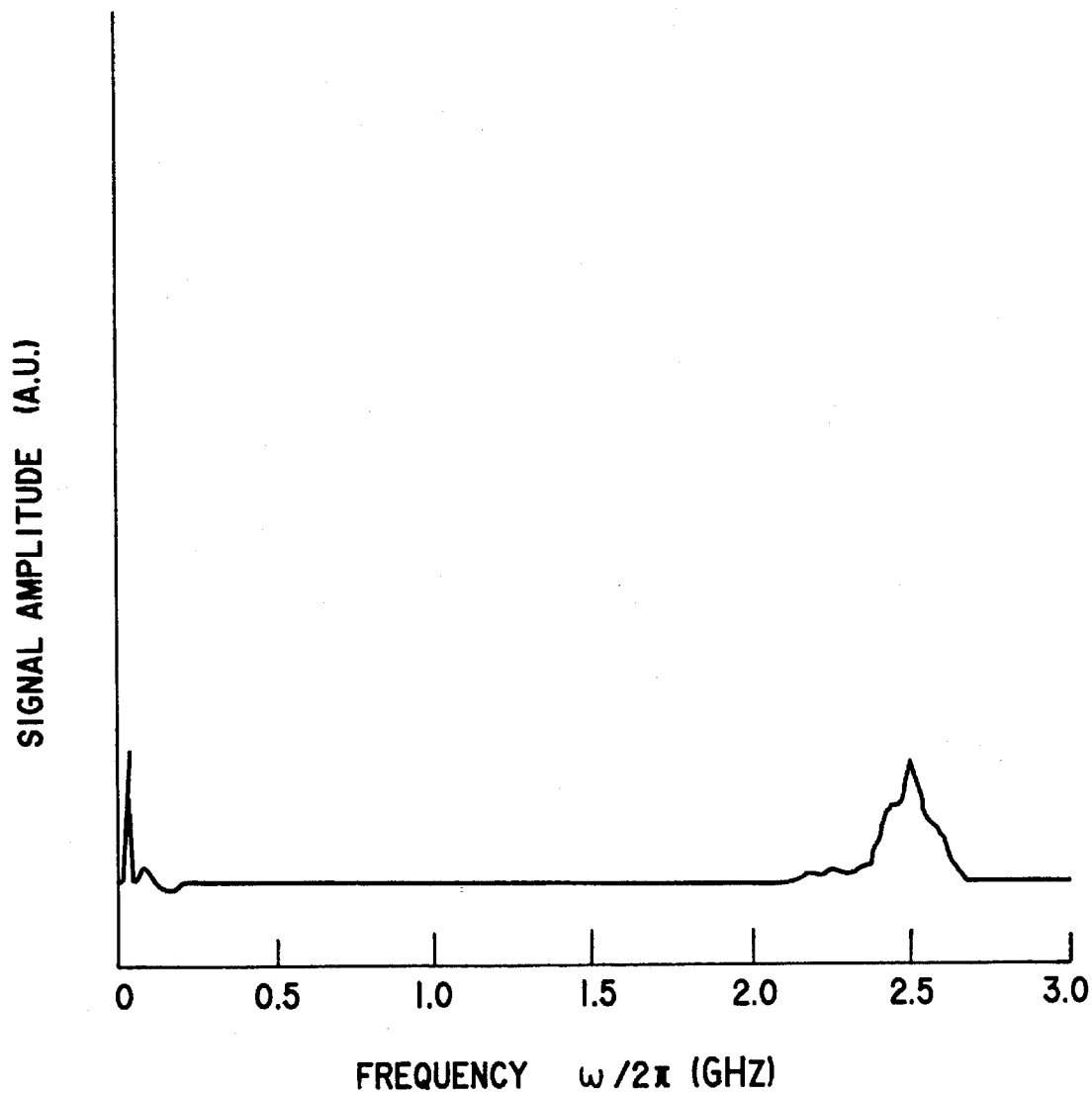
FIG. 5 shows a frequency spectrum (2) of a magnetoelectric field in a plasma detected by the antenna for the first embodiment according to the present invention.
Figure 6:
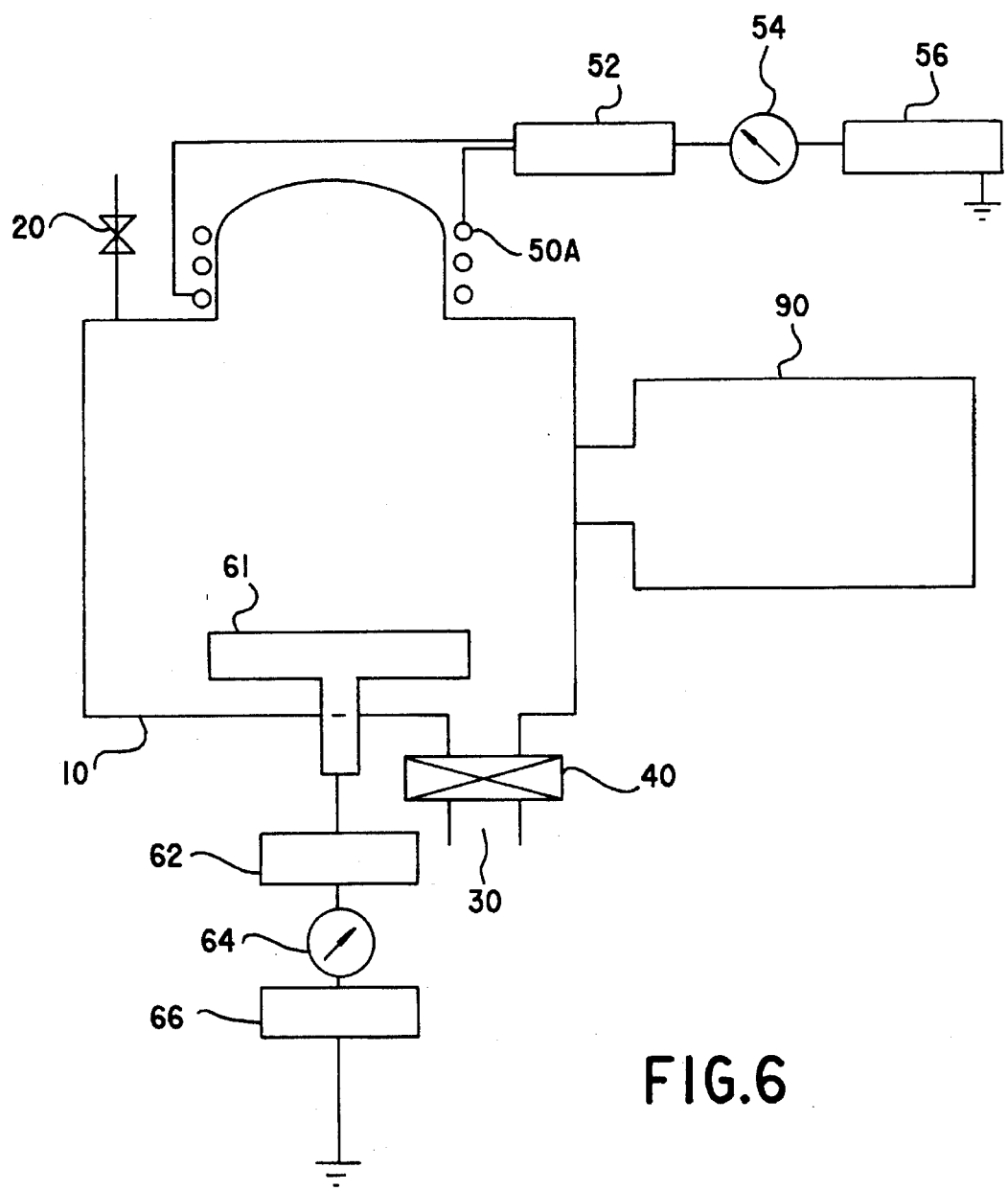
FIG. 6 shows a schematic illustration of an apparatus for the second embodiment according to the present invention.
Figure 7:
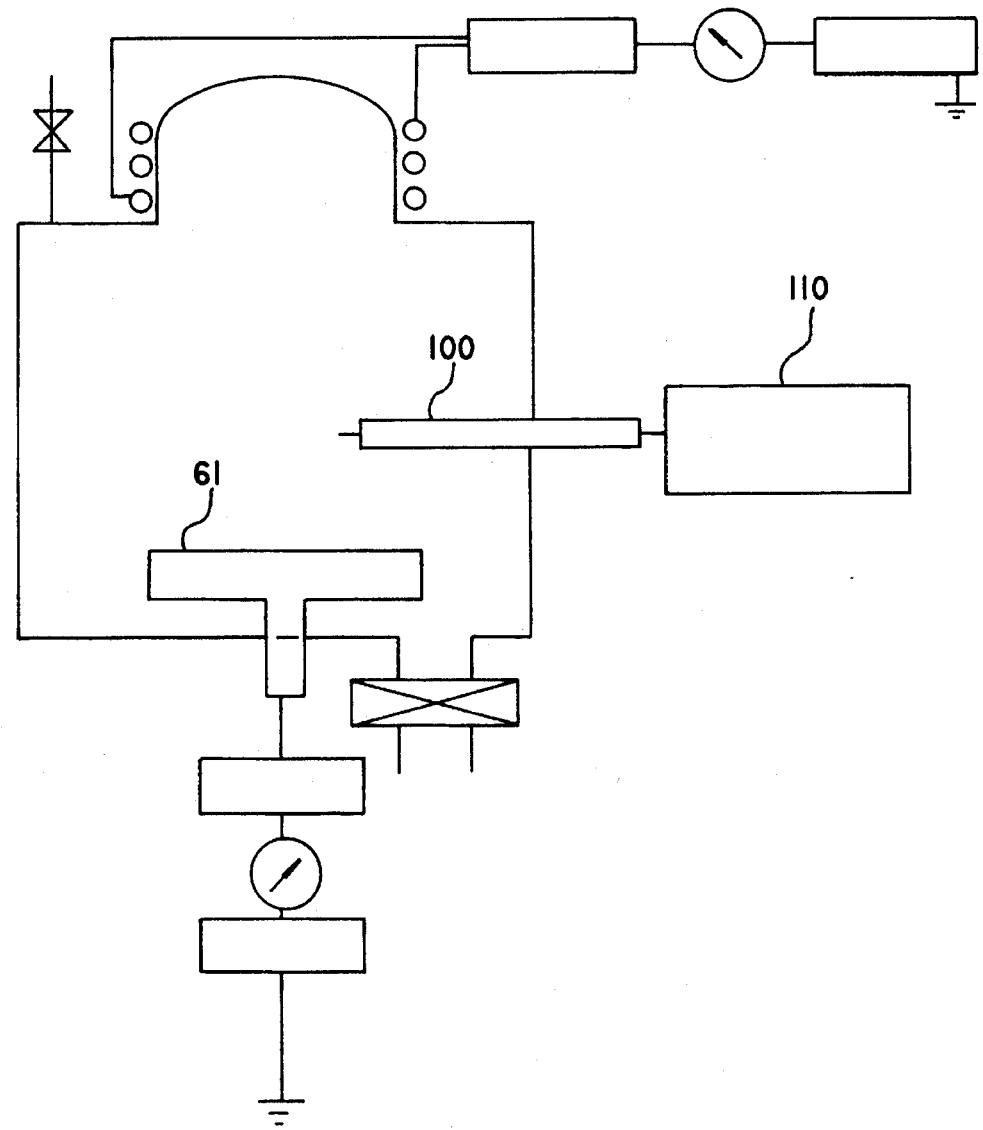
FIG. 7 also shows a schematic illustration of the apparatus with an antenna and a frequency analyzer for the second embodiment.

FIG. 6 shows a schematic illustration of an apparatus for the second embodiment according to the present invention. It illustrates a plasma generation system having a bias electrode 61, comprising a vacuum chamber 10, a control unit 20 of gas flow rate, an outlet 30, a gate valve 40, a first RF generation oscillator 66, a first impedance matching circuit 62, a first power meter 64, a 2.5 turn helical RF antenna 50A around a bell jar of quartz glass, a second impedance matching circuit 52, a second power meter 54, a second RF generation oscillator 56 and a detector unit 90. An operation was done as follows: A source gas $CF_4$ was introduced at a flow rate 20 SCCM controlled by the control unit 20, and the pressure in the chamber 10 was kept 3 mTorr controlled by the gate valve 40. A semiconductor wafer was loaded on the bias electrode 61 to be etched. A self-bias voltage of −80 V was generated on the electrode when the first RF oscillator 66 had a frequency of 200 KHz. Thus, a plasma was generated mainly in the bell jar by supplying RF power of 13.56 MHz, 800 W from the helical RF antenna 50A, and expanded to the bias electrode 61. An electron injection was taken place at the surface of the bias electrode 61 by the self-bias voltage, which generated a plasma oscillation whose frequency was then detected by the detector 90. FIG. 7 shows an antenna 100 and a frequency analyser 110 which is substantially the same as those in FIG. 4. FIG. 5 shows frequency spectrum for the second embodiment for the present invention. Since the $\omega_p$ was 2.5 GHz, the electron density $n_p$ turned out to be $7.8 \times 10^{10}$ cm$^{-3}$.

Since no tungsten filament is used in the present invention, it is, unlike a Langmuir probe, free from the metal contamination. The technique is not limited to a capacitive coupled generation plasma system, but applicable to any plasma generation system having a bias electrode, such as those of down-flow type or triode type.

Figure 8:
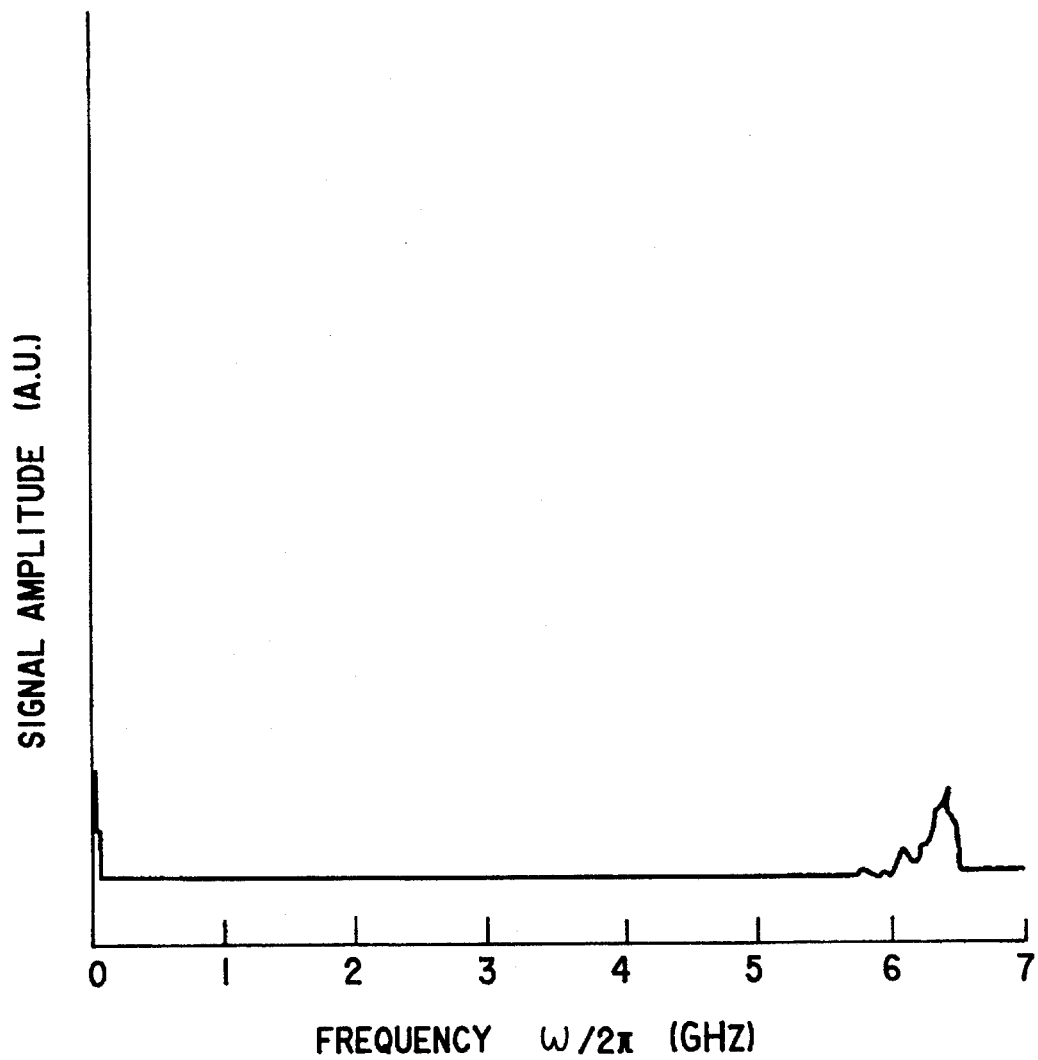
FIG. 8 shows a frequency spectrum (3) of a magnetoelectric field in a plasma detected by the antenna for the second embodiment according to the present invention.
Figure 9A:
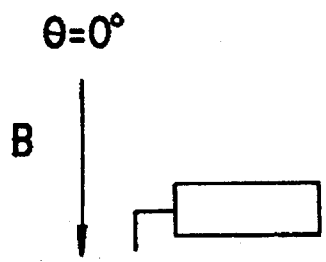
FIG. 9A shows an antenna aligned parallel to the magnetic field B.
Figure 9B:
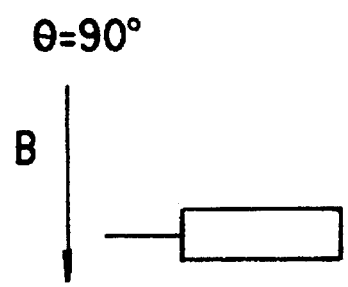
FIG. 9B shows an antenna aligned perpendicular to the magnetic field B.
Figure 9C:
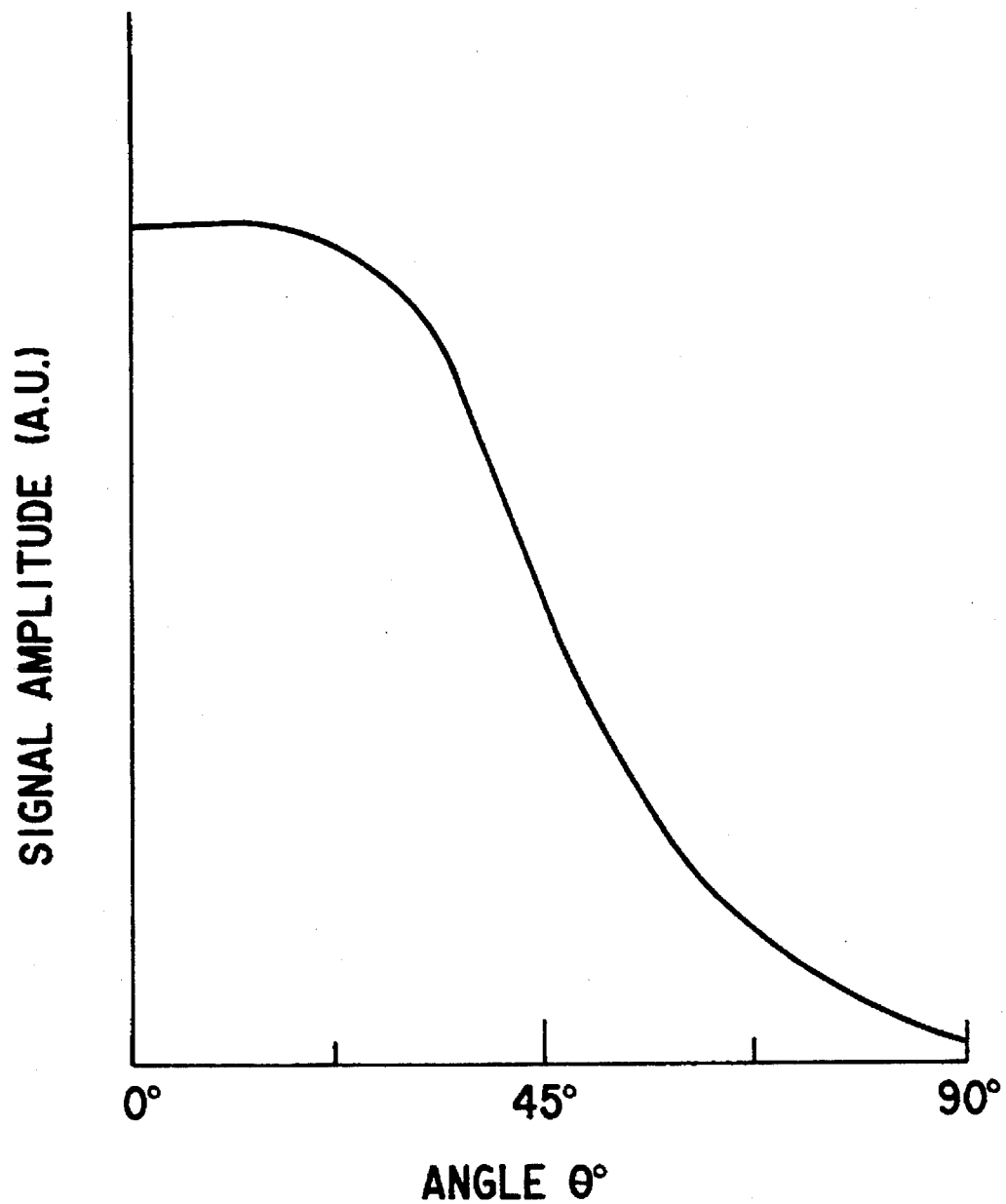
FIG. 9C shows an angular dependence of a signal amplitude of the antenna on an angle θ between the antenna and the magnetic field B.
Figure 10:
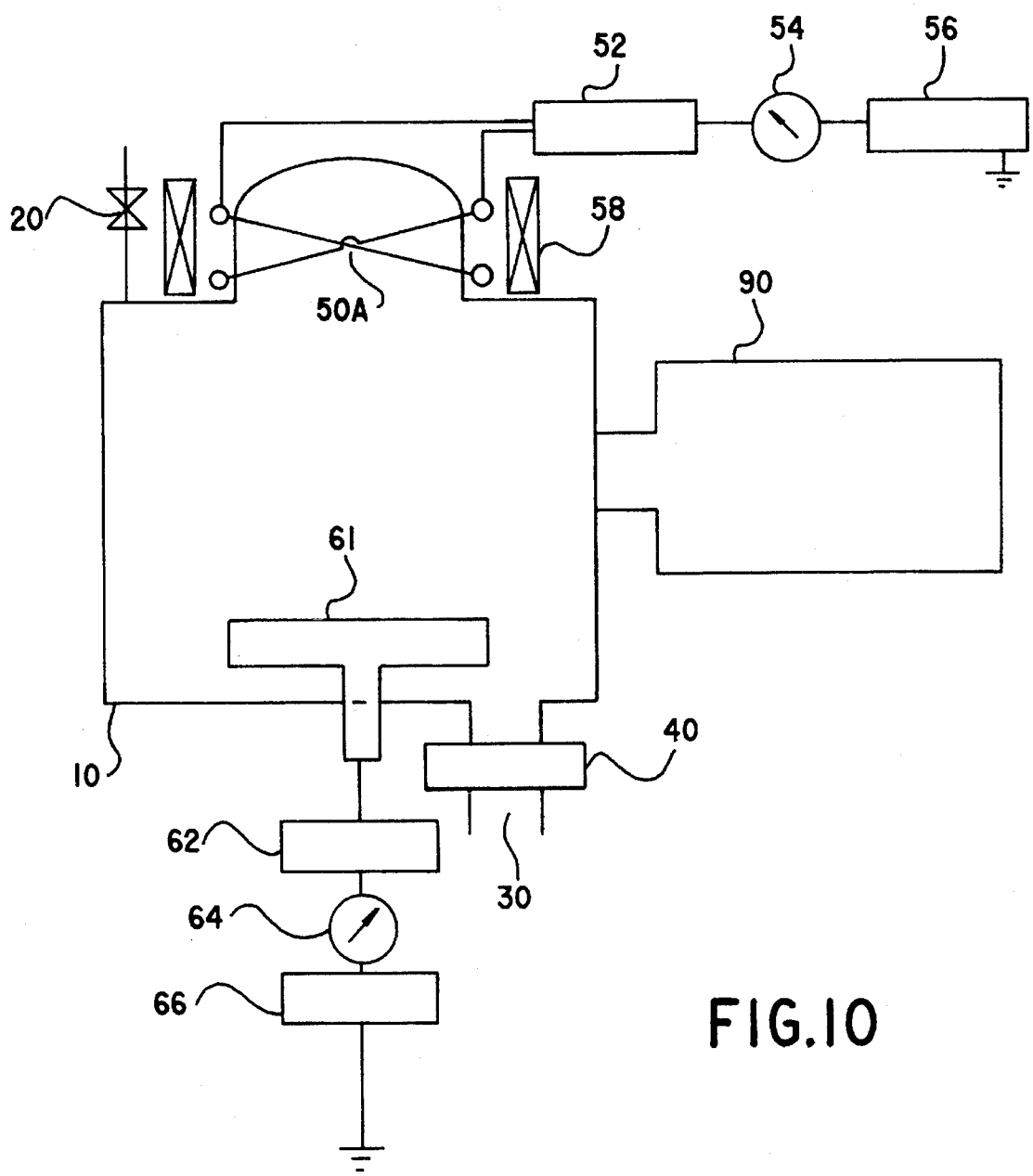
FIG. 10 shows a schematic illustration of an apparatus for the third embodiment according to the present invention.

FIG. 10 shows a schematic illustration of an apparatus for the third embodiment according to the present invention. The apparatus is essentially the same as that of the second embodiment except that a solenoid coil 58 is installed to generate a magnetic field in the chamber. An operation was done essentially the same as that for the second embodiment except for a pressure 1 mTorr, RF power 1200 W, and a magnetic field 500 G given by the solenoid coil to produce a helicon wave plasma. Since the plasma oscillation frequency $\omega_p$ was 6.4 GHz as shown in FIG. 8, the electron density $n_p=5.1\times10^{11}$ cm$^{-3}$ was given. FIG. 9C shows an angular dependence of an antenna signal amplitude on an angle θ between a direction of the antenna and a magnetic field B, wherein the amplitude gives the maximum value at θ=90°. FIG. 9A indicates that the direction of the antenna is parallel to the magnetic field B, namely θ=0 °. On the other hand, FIG. 9B indicates that the direction of the antenna is perpendicular to the magnetic field B, namely θ=90°. Hence, the antenna should be aligned within an angle of 37.1° between a direction of the antenna and a direction of the magnetic field B for a plasma reaction treatment of a wafer to detect more than 80% of the maximum amplitude of the plasma oscillation.

The present invention is not limited to the helicon wave plasma, but any other plasma generation system enhanced by a magnetic field, such as an electron cyclotron resonance typed system, or a magnetron reactive ion etching system.

Figure 12:
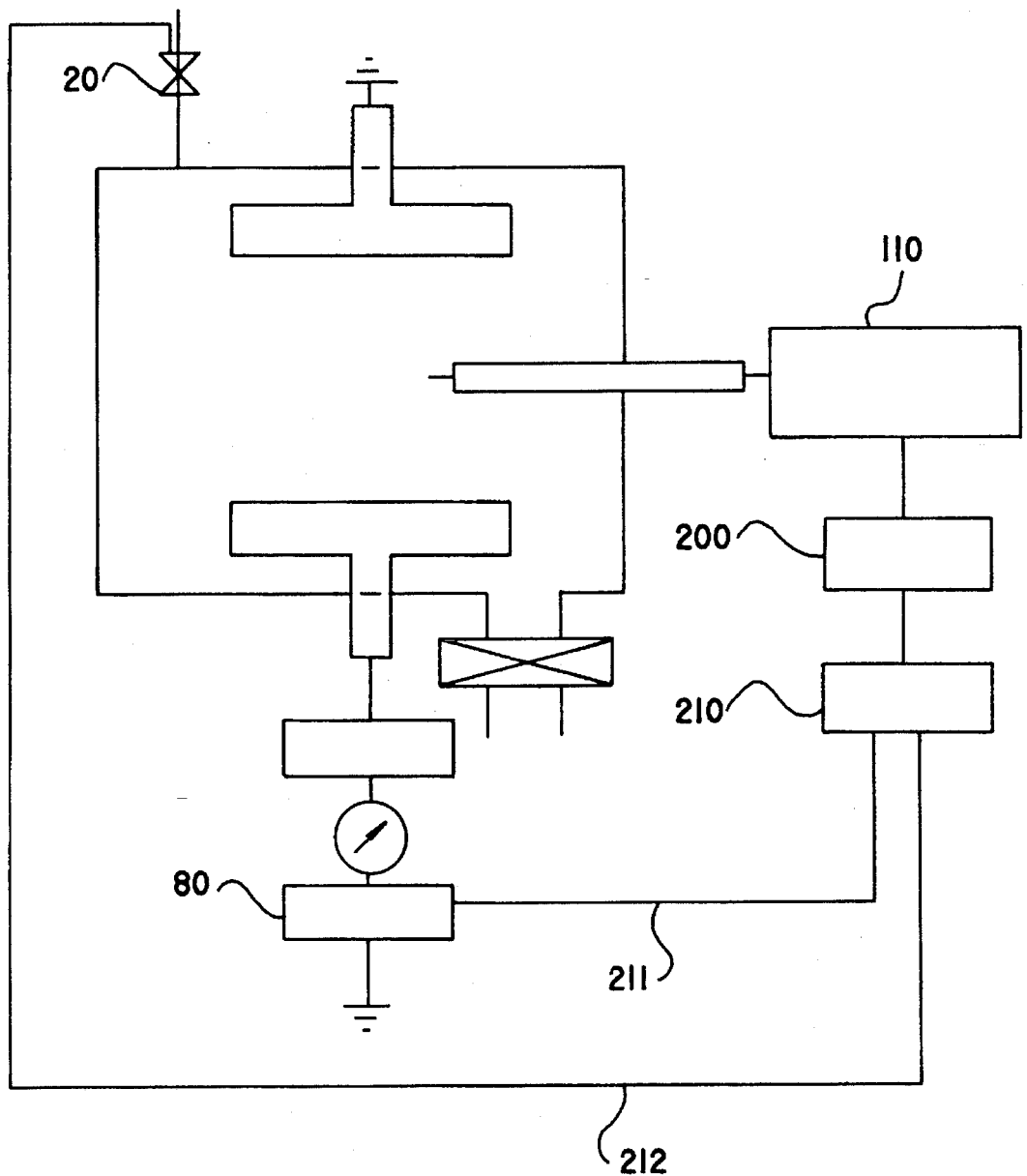
FIG. 12 shows a schematic illustration of an apparatus for the fourth embodiment according to the present invention.

FIG. 12 shows a schematic illustration of an apparatus for the fourth embodiment according to the present invention. The apparatus is essentially the same as that of the first embodiment shown in FIG. 4 except that the system has a feed-back circuit to control the electron density in the plasma to be constant. The feed-back circuit comprises a F/V converter 200, and a computer 210, wherein a plasma oscillation frequency signal detected by the frequency analyser 110 is converted to a voltage signal by the F/V converter 200 to be sent to the computer 210. The computer calculates a value of the electron density by using the equation (1), and compares it with a presetting value. An electronic signal proportional to the deviation from the presetting value is fed back to the control unit 20 of gas flow rate or the RF oscillator 80 to control flow rate or RF power by feed-back circuit 211 and 212, respectively, so that the deviation becomes substantially null. This feed-back circuit realized that the electron density was kept constant particularly in the vicinity of a wafer during etching process, which resultantly increased accuracy and reproducibility in etching process remarkably.

Figure 13:
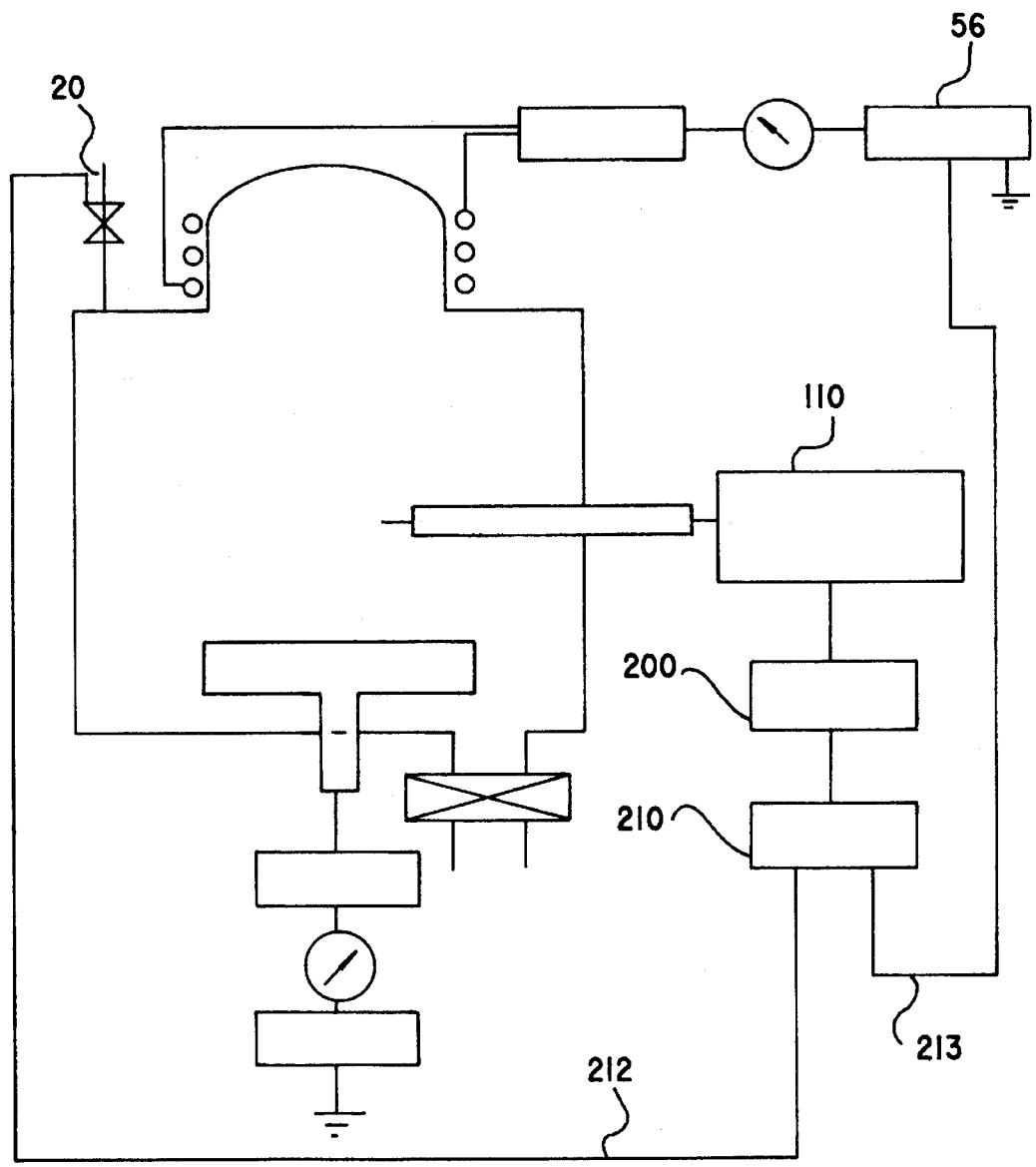
FIG. 13 shows a schematic illustration of an apparatus for the firth embodiment according to the present invention.

FIG. 13 shows a schematic illustration of an apparatus for the fifth embodiment according to the present invention. The apparatus is essentially the same as that of the second embodiment shown in FIG. 7 except that the system has a feed-back circuit to control the electron density in the plasma to be constant. The feed-back circuits 212, 213 go to the control unit 20 of gas flow rate and the RF oscillator 56 from the computer 210 to control flow rate and RF power, respectively. An operation and object are substantially the same as those in FIG. 12.

Figure 11:
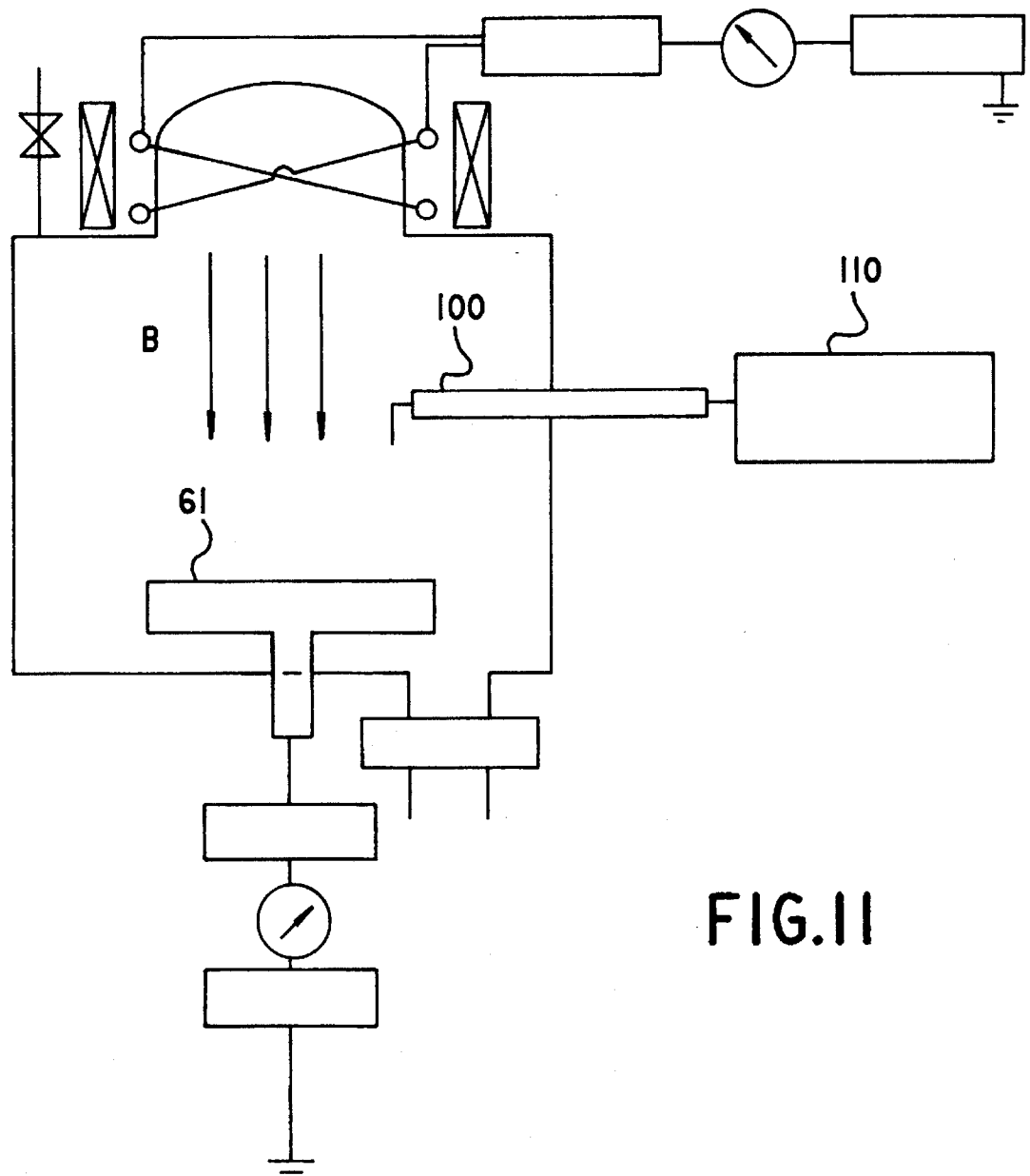
FIG. 11 also shows a schematic illustration of the apparatus with an antenna and a frequency analyzer for the third embodiment.
Figure 14:
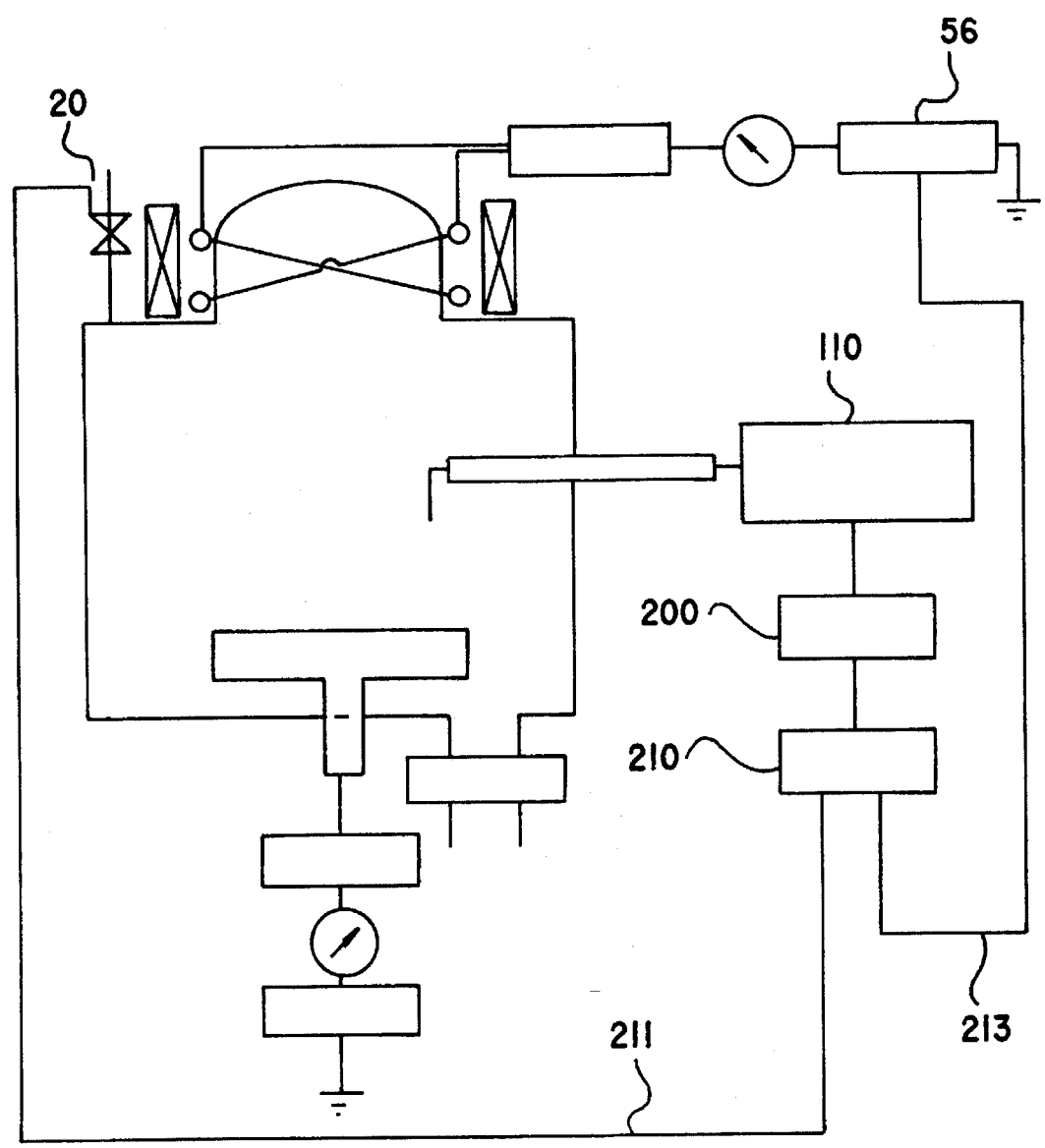
FIG. 14 shows a schematic illustration of an apparatus for the sixth embodiment according to the present invention.

FIG. 14 shows a schematic illustration of an apparatus for the sixth embodiment according to the present invention. The apparatus for etching process is essentially the same as that of the third embodiment shown in FIG. 11 except that the system has a feed-back circuit to control the electron density in the plasma to be constant. Similarly to FIG. 13, the feed-back circuits 211, 213 go to the control unit 20 of gas flow rate and the RF oscillator 56 from the computer 210 to control flow rate and RF power in this case, respectively. An operation and object are substantially the same as those in FIG. 13.

Figure 15:
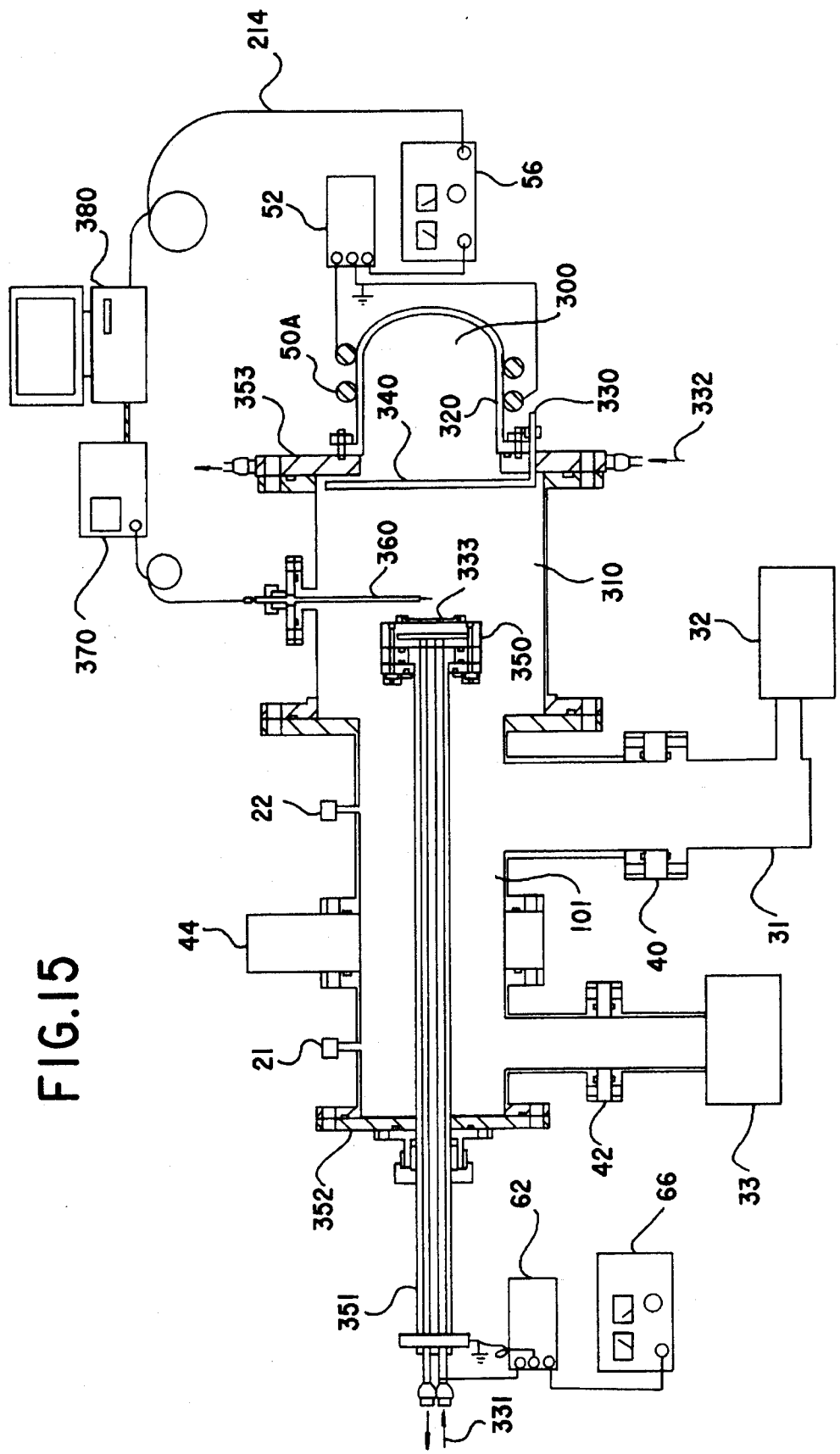
FIG. 15 shows a detailed illustration of an apparatus for the seventh embodiment according to the present invention.

FIG. 15 shows a detailed illustration of an apparatus for the seventh embodiment according to the present invention. The apparatus for etching process is essentially the same as that of the third embodiment shown in FIG. 13 except that the feed-back circuit 212 to the control unit 20 of gas flow rate is not shown. A vacuum chamber 101 is evacuated by a turbo pump 31 with another mechanical pump 32 through a gate valve 40 so that a residual pressure becomes lower than $1\times10^{-6}$ Tort while a mechanical pump 33 through a gate valve 42 is operated only when a gate valve 44 for load-lock is closed. The chamber 101 comprises a plasma generation chamber 300 and a plasma reaction chamber 310. The plasma generation chamber 300 is formed by a bell jar of quartz glass 320, and connected to the plasma reaction chamber 310 with a flange 353 cooled by liquid coolant 332. A gas diffusion ring 340 is located between the plasma generation chamber 300 and the plasma reaction chamber 310 which supplies a source gas uniformly to the both chambers through a gas inlet 330. A wafer stage 350 is located in the plasma reaction chamber 310 facing to the plasma generation chamber 300, and supported by a supporting rod 351, which has a pair of tubes for running liquid coolant 331 therein to cool the stage. The wafer 333 can be loaded and unloaded on the stage by detaching an end flange 352, wherein the gate valve 44 is capable of isolating the reaction chamber 310 from the atmospheric pressure as a load-lock mechanism. An antenna 360 for detecting the plasma oscillation frequency is set apart from the surface of the wafer 333 by 15 mm long, wherein an 80% of the maximum signal amplitude is obtained when the antenna is held at a distance between 7.5 mm and 17.5 mm from the surface of the wafer. In operation, after leak valves 21, 22 and a gate valve 42 are closed, and gate valves 40, 44 are open, the vacuum chamber 101 is evacuated below a pressure of $1\times10^{-6}$ Torr by a turbo pump 31 with a mechanical pump 32. Then, the pressure was kept at 1 mTorr by introducing $CF_4$ with a flow rate of 5 SCCM through the diffusion ring 340 and by controlling an evacuation speed at the gate valve 40. An RF power was supplied to the plasma generation chamber 300 by a 1.5 turn helical antenna 50A turned around the bell jar 320, with 13.56 MHz, 1000 W from an RF oscillator 56 through an impedance matching circuit 52. The wafer stage 350 was biased by supplying an RF power from an another RF oscillator 66 with an impedance matching circuit 62 wired to the supporting rod 351. Thus, a microwave signal received by the antenna 360 in the reaction chamber was sent to a spectral analyzer 370, and then transferred to a computer 380. At first without controlling an electron density by a feed-back circuit, a plasma oscillation frequency was measured immediately after the plasma was turned on, and then the plasma oscillation frequency spectrum was observed at 2.50 GHz, which gave an electron density $7.8\times10^{10}$ cm$^{-3}$ by Eq.(1). However, 20 minutes after the plasma was turned on, the frequency spectrum drifted to 2.38 GHz which then gave the electron density $7.0\times10^{10}$ cm$^{-3}$. The deviation amounted about 10%. Next, the signal from the computer 380 was fed back to the RF oscillator 56 by a feed-back circuit 214 to control the electron density. The first electron density $n_{p1}=7.8\times10^{10}$ cm$^{-3}$ was stored in a memory of the computer 380, and an electric signal proportional to the increment $\Delta n_p=0.8\times10^{10}$ cm$^{-3}$ was sent to the RF oscillator 56 to increase the power. Thereby, the deviation did not exceed 3% in 30 minute continuous operation.

Although the above mentioned embodiments describe etching systems using $CF_4$, needless to say that the present invention is not limited to either etching system or $CF_4$ alone, but gases could be $C_2F_6$, $SF_6$, $Cl_2$, HBr, $H_2$, $O_2$, $N_2$, Ar, He, silane, or $CH_4$, and the system could be a plasma CVD system, an X-ray system, an electron beam system, or an ion beam system.

I claim:

1. A method for measuring electron density of a plasma in a plasma reaction chamber comprising the steps of:

injecting electrons into the plasma from a space charge layer (so called "sheath") formed in a vicinity of each of a pair of electrodes by applying an alternating electromagnetic field or an alternating electromagnetic field with a bias so that electrons injected into the plasma create an unstable condition in the plasma and eventually, generate plasma oscillation, measuring a plasma oscillation frequency which gives a maximum amplitude in the plasma oscillation, and calculating the electron density of a plasma in the plasma reaction chamber by using a value of the plasma oscillation frequency.

2. An apparatus for measuring electron density of a plasma in a plasma reaction chamber comprises:

a capacitive coupled plasma generation means for generating the plasma in the plasma reaction chamber, said capacitive coupled plasma generation means having a pair of coupled electrodes wherebetween the plasma is generated, an electron injecting means for injecting electrons in the plasma so that plasma oscillation is generated, said electron injecting means having an electron emission electrode which is capable of emitting electrons by applying a high frequency electromagnetic field, an antenna for detecting an amplitude of said plasma oscillation, and a frequency measuring means for measuring a plasma frequency which gives a maximum amplitude of the plasma oscillation.

3. An apparatus for measuring electron density of a plasma in a plasma reaction chamber comprising:

a plasma generating means for generating the plasma in a plasma generation chamber neighboring to the plasma reaction chamber, an electron injecting means for injecting electrons into the plasma of the plasma reaction chamber, said electron injecting means having a pair of electrodes to which an alternating electromagnetic field is applied so that electrons in a space charge layer formed in a vicinity of each of a pair of the electrodes are accelerated to be injected into the plasma which eventually, generate plasma oscillation, an antenna for detecting an amplitude of said plasma oscillation, and a frequency measuring means for measuring a plasma oscillation frequency which gives a maximum amplitude of said plasma oscillation.

4. The apparatus according to claim 3, wherein said plasma generating means is a magnetically enhanced microwave plasma generation system which generates the plasma enhanced by a divergent magnetic field in the plasma generation chamber so that the generated plasma is transported directionally to the plasma reaction chamber.

5. The apparatus according to claim 4, wherein said frequency measuring means is a frequency analyzer which is capable of detecting a signal amplitude with respect to each frequencies.

6. The apparatus according to claim 2, further comprising a control means for maintaining the electron density constant, said control means comprising a frequency-voltage converter, a computer, and feed-back circuits:

the frequency-voltage converter for converting a signal amplitude of the plasma oscillation frequency detected by the frequency analyzer to a voltage signal which is sent to the computer, the computer for calculating a value of the electron density by using the plasma oscillation frequency in terms of the voltage signal, comparing the value with a presetting value to give a deviation of the value from the presetting value, and producing an electronic signal proportional to the deviation, and the feed-back circuits for feeding back the electronic signal of the deviation to a control unit of gas flow rate or to an RF oscillator so as to make the deviation null, the control unit of gas flow rate which controls a flow rate of a source gas to a plasma generation chamber, and the RF oscillator which supplies RF power to the plasma generation chamber.

7. The apparatus according to claim 2, wherein one of a pair of said coupled electrodes is a stage on which a semiconductor wafer is loaded to be exposed to the plasma.

8. The apparatus according to claim 3, further comprising one of a pair of said electrodes is a stage on which a semiconductor wafer is loaded to be exposed to the plasma.

9. The apparatus according to claim 3, further comprising a gas diffusion means for diffusing a source gas in the plasma uniformly, said gas diffusion means being located between the plasma generation chamber and the plasma reaction chamber.

10. The apparatus according to claim 3, wherein said antenna is located at a distance between 7.5 mm and 17.5 mm from a wafer.

11. The apparatus according to claim 3, wherein said antenna is aligned so that an angle between a direction of said antenna and a direction of the magnetic field is less than 37.1° to detect an 80% of a maximum amplitude of the plasma oscillation.

* * * * *

UNITED STATES PATENT AND TRADEMARK OFFICE
CERTIFICATE OF CORRECTION

PATENT NO. : 5,471,115
DATED : November 28, 1995
INVENTOR(S) : Hikosaka, Yukinobu It is certified that error appears in the above-indentified patent and that said Letters Patent is hereby corrected as shown below:

Delete Figures 1 and 4, and substitute therefor the Drawing Sheets, consisting of Figures 1 and 4, as shown on the attached pages.

Signed and Sealed this

Twenty-second Day of July, 1997

Attest:

Attesting Officer

BRUCE LEHMAN

Commissioner of Patents and Trademarks